US008441853B2

(12) United States Patent
Li

(10) Patent No.: US 8,441,853 B2
(45) Date of Patent: May 14, 2013

(54) SENSING FOR NAND MEMORY BASED ON WORD LINE POSITION

(75) Inventor: Haibo Li, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 298 days.

(21) Appl. No.: 12/894,922

(22) Filed: Sep. 30, 2010

(65) Prior Publication Data

US 2012/0081964 A1  Apr. 5, 2012

(51) Int. Cl.
    *G11C 16/04* (2006.01)
(52) U.S. Cl.
    USPC ............ 365/185.17; 365/185.06; 365/185.33; 365/185.05
(58) Field of Classification Search ............. 365/185.17, 365/185.06, 185.33, 185.05
    See application file for complete search history.

(56) References Cited

U.S. PATENT DOCUMENTS

| | | | |
|---|---|---|---|
| 5,673,223 A | 9/1997 | Park | |
| 6,125,052 A | 9/2000 | Tanaka | |
| 6,327,202 B1 | 12/2001 | Roohparvar | |
| 6,850,439 B1 * | 2/2005 | Tanaka | 365/185.17 |
| 6,891,758 B2 | 5/2005 | Roohparvar | |
| 6,975,542 B2 | 12/2005 | Roohparvar | |
| 6,982,905 B2 | 1/2006 | Nguyen | |
| 7,082,055 B2 * | 7/2006 | Ichige et al. | 365/185.17 |
| 7,295,486 B2 | 11/2007 | Chen | |
| 7,342,831 B2 | 3/2008 | Mokhlesi et al. | |
| 7,411,826 B2 * | 8/2008 | Ichige et al. | 365/185.17 |
| 7,468,919 B2 | 12/2008 | Sekar et al. | |
| 7,583,535 B2 | 9/2009 | Sekar et al. | |
| 7,596,035 B2 | 9/2009 | Doyle et al. | |
| 7,663,929 B2 | 2/2010 | Ogawa | |
| 7,668,001 B2 | 2/2010 | Tajiri et al. | |
| 7,688,614 B2 | 3/2010 | Morimoto | |
| 2002/0031003 A1 | 3/2002 | Hoya et al. | |
| 2006/0133142 A1 * | 6/2006 | Futatsuyama | 365/185.11 |
| 2006/0280021 A1 | 12/2006 | Chen | |

(Continued)

FOREIGN PATENT DOCUMENTS

| | | |
|---|---|---|
| GB | 2332766 A | 6/1999 |
| JP | 2007080424 A | 3/2007 |

OTHER PUBLICATIONS

Invitation to Pay Additional Fees and Communication Relating to the Results of the Partial International Search dated Nov. 21, 2011.

(Continued)

*Primary Examiner* — Connie Yoha
(74) *Attorney, Agent, or Firm* — Vierra Magen Marcus LLP

(57) ABSTRACT

In a NAND non-volatile memory system, a sensing process accounts for a relative position of a selected non-volatile storage element in a NAND string. In one approach, the storage elements are assigned to groups based on their position, and each group receives a common sensing adjustment during a verify or read process. A group which is closest to a source side of the NAND string may be the largest of all the groups, having at least twice as many storage elements as the other groups. The adjusting can include adjusting a sensing parameter such as body bias, source voltage, sensing time or sensing pre-charge level, based on the position of the sensed storage element or its associated word line position. The adjusting of the sensing may also be based on the control gate voltage and the associated data state involved in a specific sensing operation.

20 Claims, 15 Drawing Sheets

U.S. PATENT DOCUMENTS

2008/0094900 A1 * 4/2008 Nakamura et al. ....... 365/185.11
2008/0159007 A1    7/2008 Sekar et al.
2008/0253217 A1   10/2008 Taeuber et al.
2009/0080265 A1    3/2009 Mokhlesi et al.
2010/0128532 A1    5/2010 Hwang et al.

OTHER PUBLICATIONS

International Search Report & The Written Opinion of the International Searching Authority dated Mar. 21, 2012, International Application No. PCT/US2011/053550.

* cited by examiner

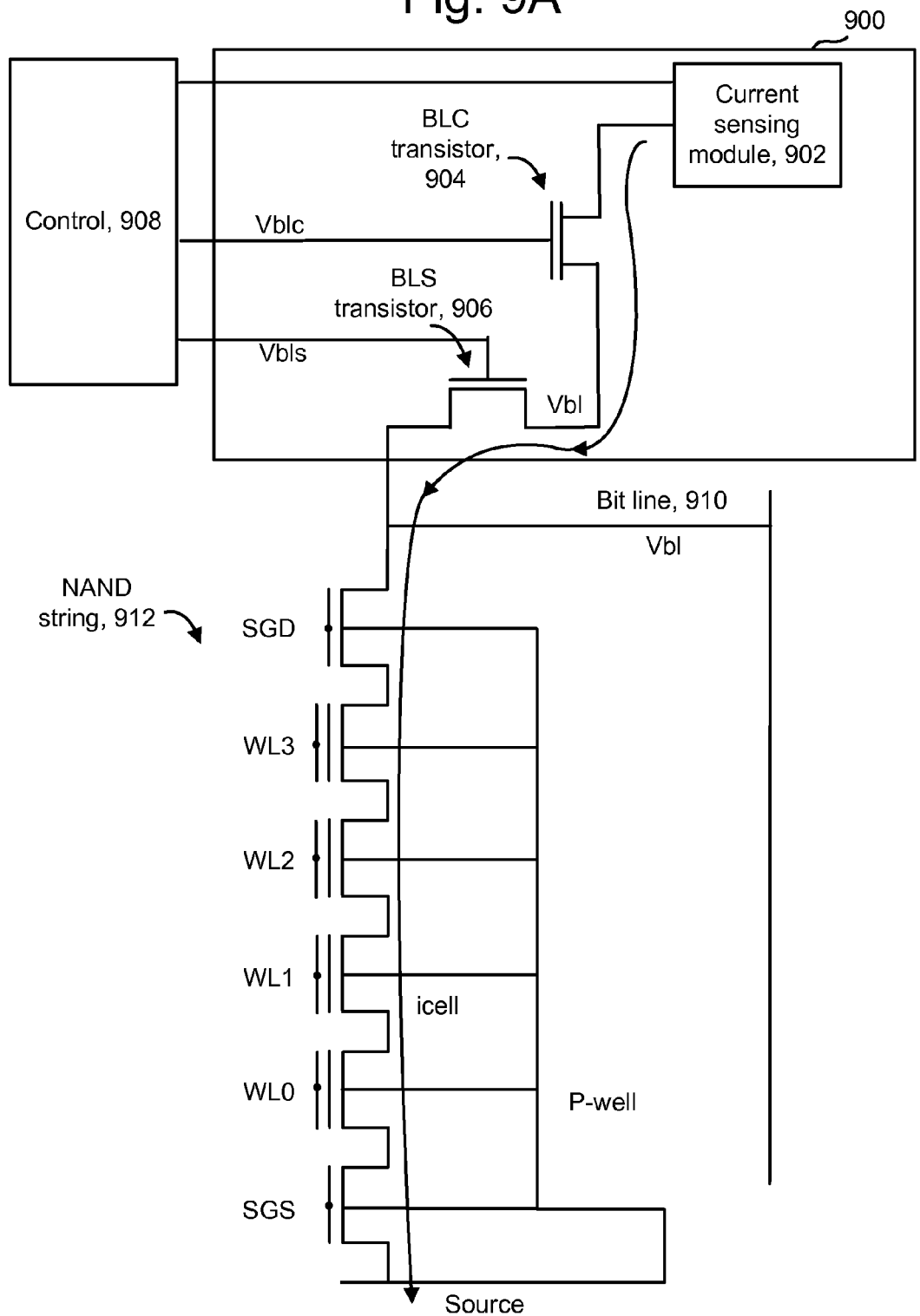

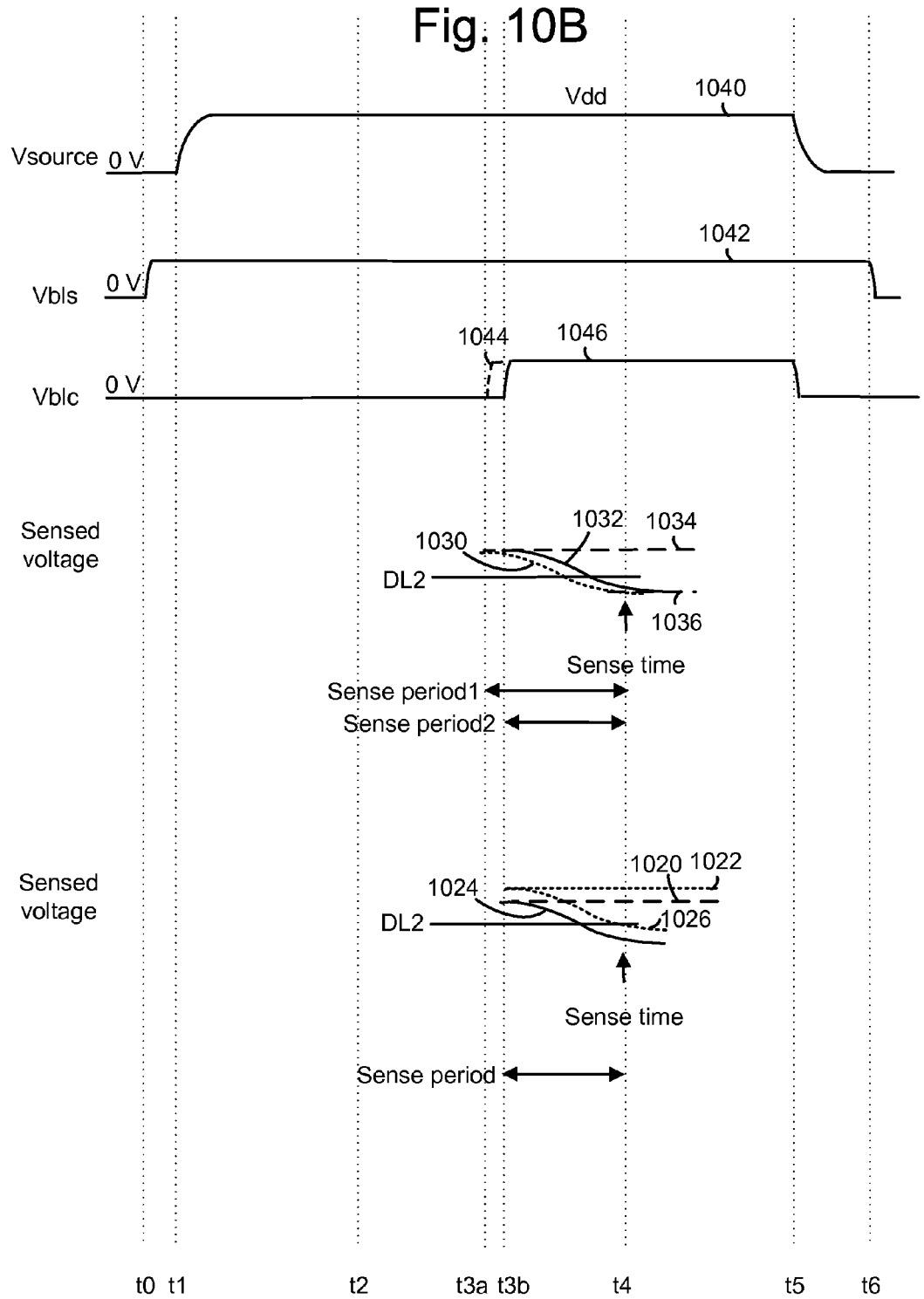

SENSING FOR NAND MEMORY BASED ON WORD LINE POSITION

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple, e.g., four or more, distinct allowed/valid programmed threshold voltage ranges. Each distinct threshold voltage range corresponds to a predetermined value for the set of data bits encoded in the memory device. For example, each storage element can store two bits of data when the element can be placed in one of four discrete charge bands corresponding to four distinct threshold voltage ranges.

Typically, a program voltage Vpgm applied to the control gate during a program operation is applied as a series of pulses that increase in magnitude over time. The program voltage can be applied to a selected word line. In one possible approach, the magnitude of the pulses is increased with each successive pulse by a predetermined step size, e.g., 0.2-0.4 V. Vpgm can be applied to the control gates of flash memory elements. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

However, as memory devices continue to be scaled down in size, accurate programming becomes more difficult.

BRIEF DESCRIPTION OF THE DRAWINGS

FIG. 9A depicts a configuration of a NAND string and sensing circuitry when current sensing is used.

FIG. 10B depicts waveforms associated with FIG. 10A.

DETAILED DESCRIPTION

A method and non-volatile storage system are provided in which a sensing process compensates for a relative position of a selected non-volatile storage element in a NAND string.

In a memory system, a sensing process can occur as part of a verify operation, during programming, or as part of a read operation, when a previously-programmed data state is ascertained. However, a threshold voltage (Vth) distribution of the programmed data states depends on a relative position of a selected non-volatile storage element in a NAND string. This position can be represented also, e.g., by a relative position of an associated selected word line. This dependency is due to various factors, including a so-called back pattern effect, which is caused by a programming order. Typically, storage elements near the source side of the NAND string are programmed before storage elements near the drain side of the NAND string. As a result, a higher resistance is presented by the already-programmed storage elements when the drain-side storage elements are programmed, causing a shift in the Vth of the drain-side storage elements compared to the Vth of the source-side storage elements. The drain-side storage elements thereby can have a wider Vth distribution. Moreover, this problem will become more severe as additional word lines are added to a block.

Techniques are provided for reducing the word line position dependence of the Vth distribution and for tightening the Vth distributions. A sensing process is adjusted based on the word line position to compensate for the above-mentioned effects. The adjusting can include adjusting a sensing parameter such as body bias, source voltage, sensing time or sensing pre-charge level, based on the word line position. Moreover, the storage elements or word line may be assigned to groups, where each group receives a common sensing adjustment. This is an efficient approach which does not require a custom setting for each word line. Observations indicate that most of the source-side storage elements are not significantly affected by word line position and can be treated equally. Other, smaller groups can be provided for the higher, drain-side word line. Further, the adjusting of the sensing may be based on the control gate voltage and the associated data state involved in a specific sensing operation. For example, in some cases, one or more lower states are less affected than higher states by the above-mentioned effects, so that a lower sensing adjustment or no sensing adjustment can be used for the one or more lower states.

Figure 1:
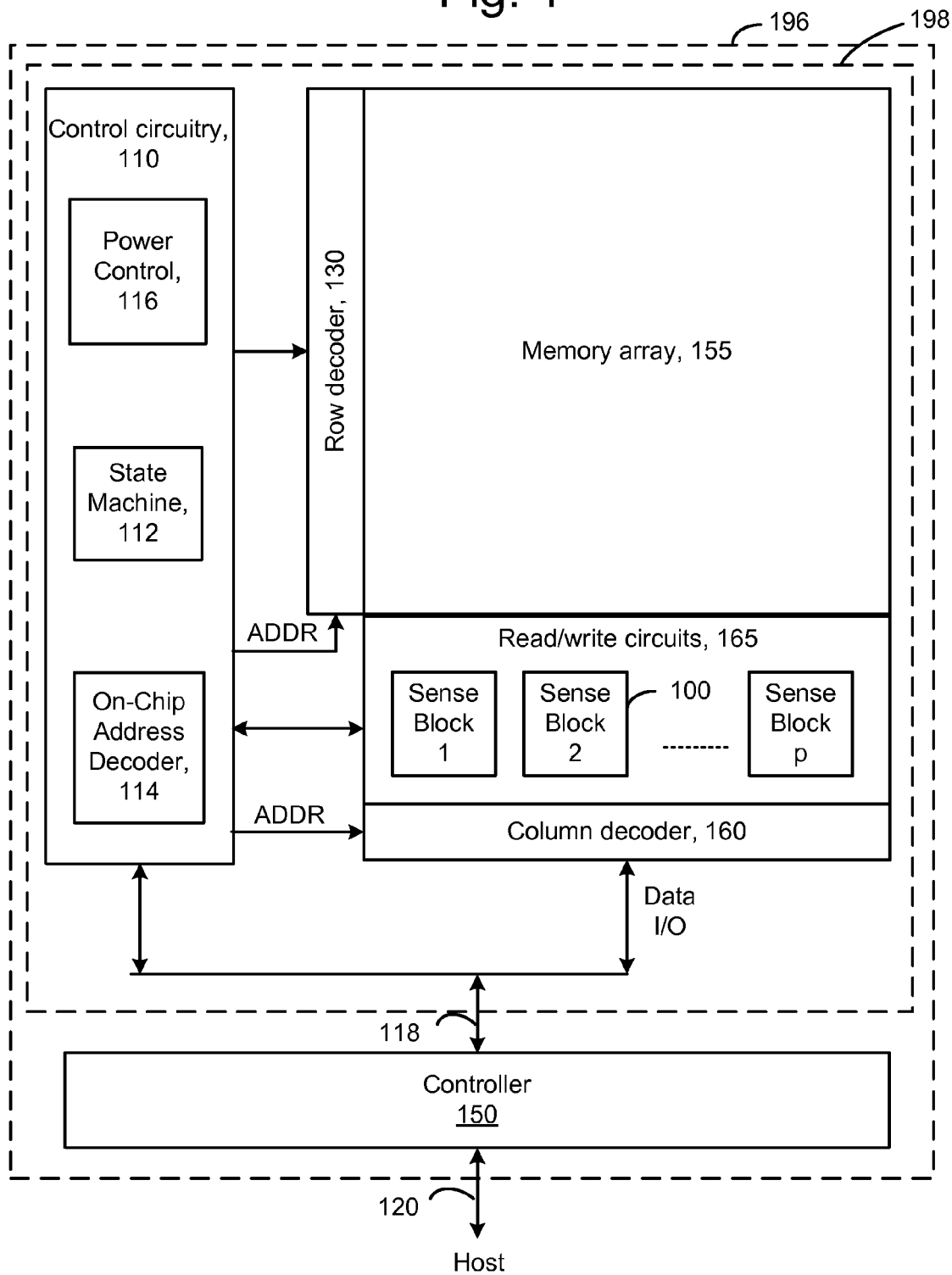
FIG. 1 is a block diagram of a non-volatile memory system using single row/column decoders and read/write circuits.

An example memory system which can be used is discussed next. FIG. 1 is a block diagram of a non-volatile memory system using single row/column decoders and read/write circuits. The diagram illustrates a memory device 196 having read/write circuits for reading and programming a page of storage elements in parallel, according to one embodiment. Memory device 196 may include one or more memory die 198. Memory die 198 includes a two-dimensional memory array of storage elements 155, control circuitry 110, and read/write circuits 165. The memory array 155 is discussed further in connection with FIG. 2.

In some embodiments, the array of storage elements can be three dimensional. The memory array 155 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 196 (e.g., a removable storage card) as the one or more memory die 198. Commands and data are transferred between the host and controller 150 via lines 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations.

In some implementations, some of the components of FIG. 1 can be combined. In various designs, one or more of the components (alone or in combination), other than memory array 155, can be thought of as a control circuit. For example, one or more control circuits may include any one of, or a combination of, control circuitry 110, state machine 112, decoders 114/160, power control 116, sense blocks 100 (including the processor 192 in FIG. 2), read/write circuits 165, and controller 150, etc. The sense block 100 is discussed further in connection with FIG. 2.

In another embodiment, a non-volatile memory system uses dual row/column decoders and read/write circuits. Access to the memory array 155 by the various peripheral circuits is implemented in a symmetric fashion, on opposite sides of the array, so that the densities of access lines and circuitry on each side are reduced by half Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

Figure 2:
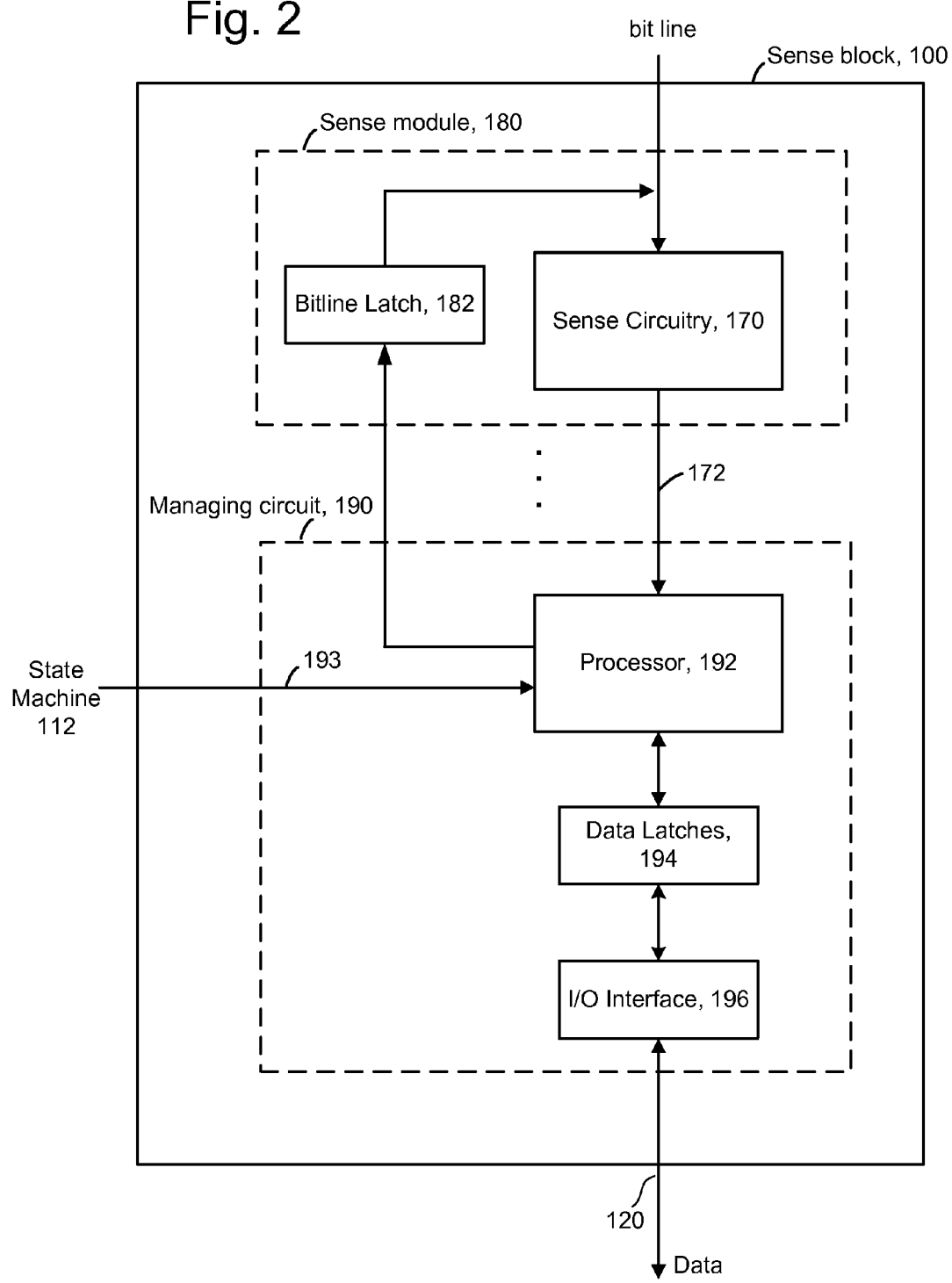
FIG. 2 is a block diagram depicting one embodiment of the sense block 100 of FIG. 1.

FIG. 2 is a block diagram depicting one embodiment of a sense block. An individual sense block 100 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that determines whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a value of FLG=0 can inhibit programming, while FLG=1 does not inhibit programming.

Managing circuit 190 comprises a processor 192, a set of data latches 194 and an I/O Interface 196 coupled between the set of data latches 194 and data bus 120. Processor 192 performs computations, such as to determine the data stored in the sensed storage element and store the determined data in the set of data latches. The set of data latches 194 is used to store data bits determined by processor 192 during a read operation, and to store data bits imported from the data bus 120 during a program operation. The imported data bits represent write data intended to be programmed into the memory. I/O interface 196 provides an interface between data latches 194 and the data bus 120.

During reading, the operation of the system is under the control of state machine 112 that controls the supply of different control gate voltages to the addressed storage element. As it steps through the one or more various predefined control gate voltages corresponding to the various memory states supported by the memory, the sense module 180 may trip at one of these voltages and an output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194. In another embodiment, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194 from the data bus 120. The program operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Data latch stack 194 contains a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 3A:
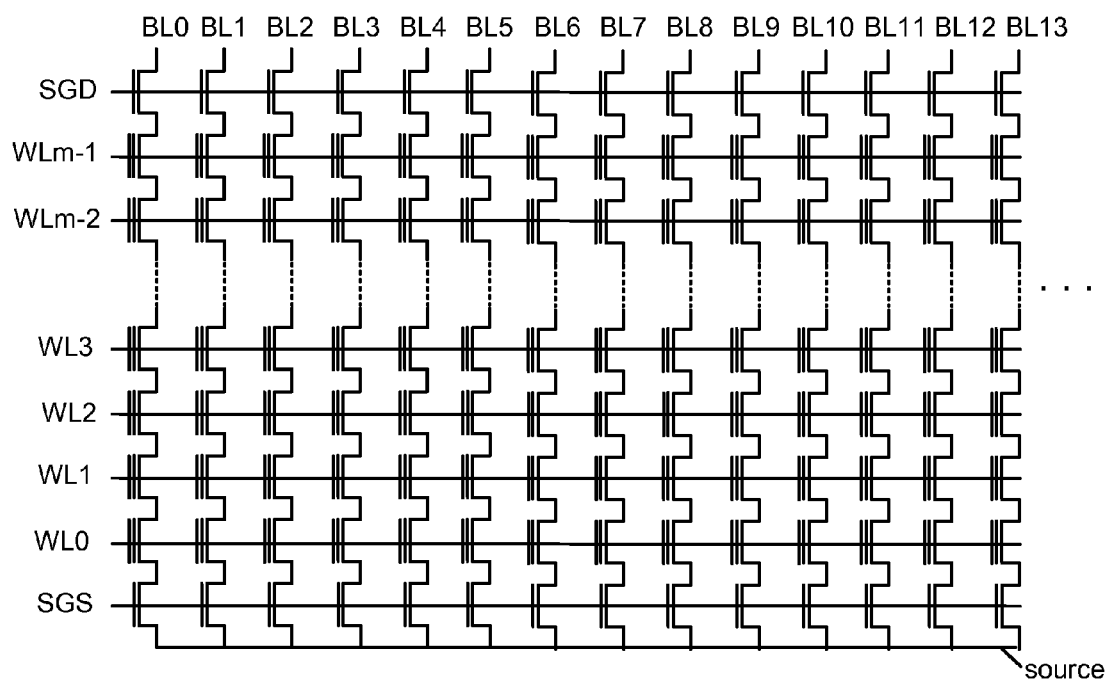
FIG. 3A depicts an example block in a memory array, such as the memory array 155 of FIG. 1.

FIG. 3A depicts an example block in a memory array, such as the memory array 155 of FIG. 1. The block includes example bit lines BL0, BL1, BL2, ... and m word lines WL0 through WLm−1. SGS represents a common control line for a source-side select gate, SGD represents a common control line for a drain-side select gate, and "source" represents a common source line for the block.

Figure 3B:
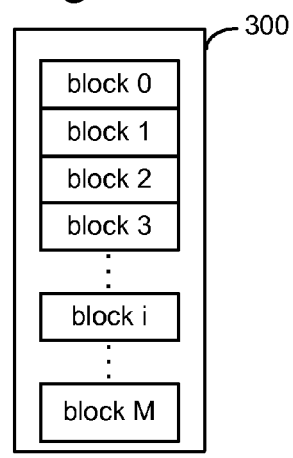
FIG. 3B depicts a memory array 300 comprising multiple blocks, such as the block of FIG. 3A.

FIG. 3B depicts a memory array 300 comprising multiple blocks, such as the block of FIG. 3A. As one example, a NAND flash EEPROM is described that is partitioned into M=1,024 blocks. The data stored in each block can be simultaneously erased. In one embodiment, the block is the minimum unit of storage elements that are simultaneously erased. Storage elements can be erased by raising the p-well to an erase voltage (e.g., 14-22 V) and grounding the word lines of a selected block while floating the source and bit lines. Erasing can be performed on the entire memory array, separate blocks, or another unit of the storage elements which is a portion of the memory device. During erasing, electrons are transferred from the floating gates of the storage elements to the p-well region so that the Vth of the storage elements becomes negative. A strong electric field is applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the Vth of a selected storage element is lowered.

Figure 4:
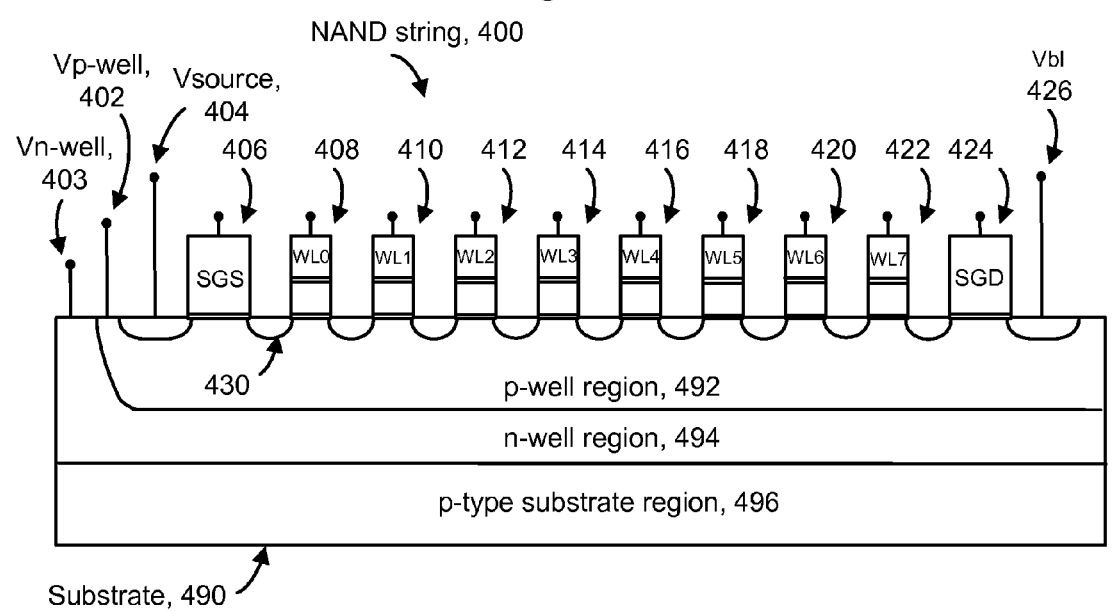
FIG. 4 depicts a cross-sectional view of a NAND string formed on a substrate.

FIG. 4 depicts a cross-sectional view of an NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of Vsource (Vsrc) is provided in addition to a bit line 426 with a potential of Vb1. In one possible approach, a voltage Vp-well can be applied to the p-well region 492 via a terminal 402. A voltage Vn-well can also be applied to the n-well region 494 via a terminal 403. A body bias can be expressed by V-pwell−Vsource or Vn-well−Vsource.

During a sensing operation such as a read or verify operation, including an erase-verify operation, in which the condition of a storage element, such as its Vth, is ascertained, a control gate voltage is provided on a selected word line which is associated with a selected storage element. Further, the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A read pass voltage, Vread, can be applied to unselected word lines associated with NAND string 400, in one possible boosting scheme. Other boosting schemes apply Vread to some word lines and lower voltages to other word lines. Vsgs and Vsgd are applied to the select gates 406 and 424, respectively.

Figure 5A:
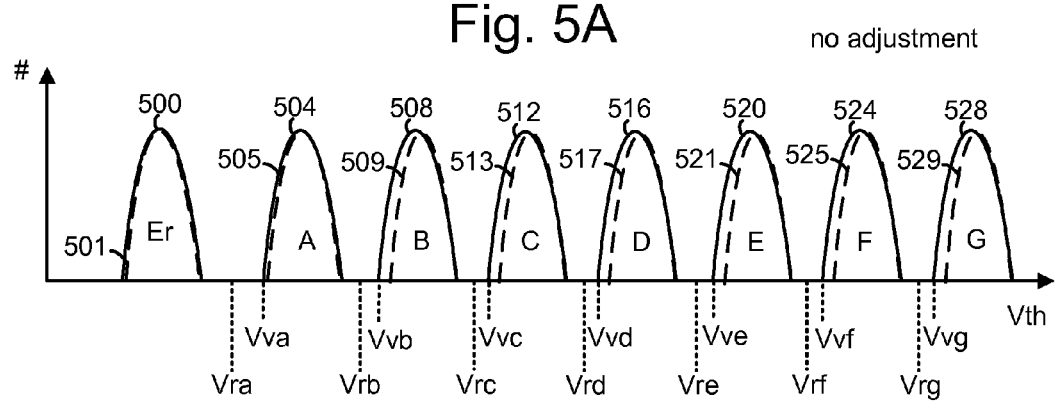
FIG. 5A depicts an example set of threshold voltage distributions in a memory device, where word line-position effects are apparent and no adjusted sensing technique is used.

FIG. 5A depicts an example set of Vth distributions in a memory device, where word line-position effects are apparent and no adjusted sensing technique is used. A multi-level device is represented where multiple bits are stored in each storage element. In this example, each storage element stores N=3 bits of data, and there are $2^N$=8 data states. A first Vth distribution 500 is provided for erased (Er state) storage elements, while Vth distributions 504, 508, 512, 516, 520, 524 and 528 represent programmed states A, B, C, D, E, F and G, respectively for drain-side storage elements. Vth distributions 505, 509, 513, 517, 521, 525 and 529 represent programmed states A, B, C, D, E, F and G, respectively for source-side storage elements. Distributions 500 and 501 are provided for the erased (Er) state for the drain- and source-side storage elements.

As mentioned at the outset, Vth distributions can vary based on the word line position of the storage elements, such that the distributions of storage elements which are closer to the drain-side of a NAND string are wider, and have lower tails compared to the source-side storage elements. In one embodiment, the Vth distribution in the Erased (Er) distribution is negative and the remaining Vth distributions are positive.

Each distinct Vth range corresponds to predetermined values for the set of data bits. The specific relationship between the data programmed into the storage element and the Vth levels of the storage element depends upon the data encoding scheme adopted for the storage elements. Although eight states are shown, four or sixteen data states can also be used.

Read reference voltages, Vra, Vrb, Vrc, Vrd, Vre, Vrf and Vrg, which are associated with data states A, B, C, D, E, F and G, respectively, are also provided for reading data from the storage elements. By applying the read reference voltage to the control gate of a storage element, a sensing operation can determine whether the Vth of the storage element is above or below the read reference voltage. Generally, $2^N-1$ read levels are used when there are $2^N$ states.

Further, verify reference voltages, Vva, Vvb, Vvc, Vvd, Vve, Vvf and Vvg, which are associated with data states A, B, C, D, E, F and G, respectively, are provided. When programming storage elements to state A, B, C, D, E, F or G, the system will test whether those storage elements have a Vth greater than or equal to Vva, Vvb, Vvc, Vvd, Vve, Vvf and Vvg, respectively. Various programming schemes are known, includes single pass and multiple-pass schemes. Generally, $2^N-1$ sense levels are used when there are $2^N$ states.

The drain-side storage elements are associated with the higher-numbered word lines, assuming numbering of the word lines begins at the source side of a NAND string. On the other hand, the source-side storage elements are associated with the lower-numbered word lines. The distributions of one or more of the lowest states, such as the Er state and the lowest programmed state, the A state, tend to have less of a word line position dependency. For the A state, this is indicated by the distribution 504 being similar to the distribution 505.

Figure 5B:
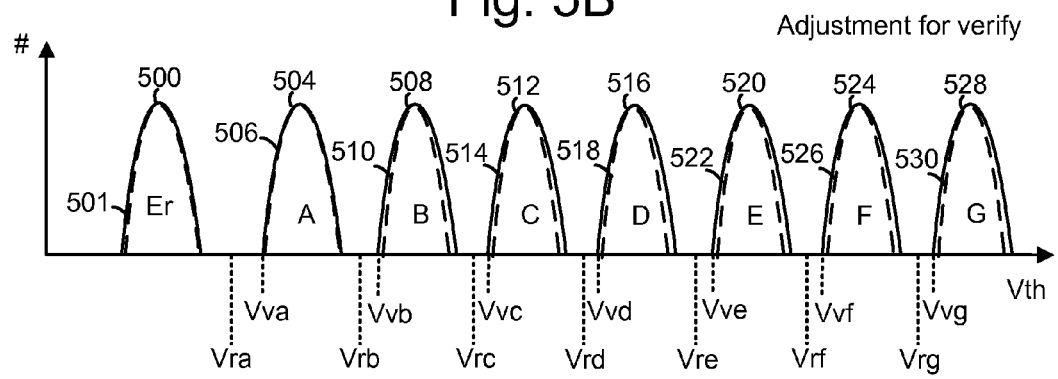
FIG. 5B depicts the example set of threshold voltage distributions of FIG. 5A, where word line-position effects are reduced using adjusted sensing techniques, during a verify operation.

FIG. 5B depicts the example set of Vth distributions of FIG. 5A, where word line-position effects are reduced using adjusted sensing techniques, during a verify operation. The distributions for the drain-side storage elements (distributions 504, 508, 512, 516, 520, 524 and 528) are the same as in FIG. 5A. However, the new distributions for the source-side storage elements (distributions 506, 510, 514, 518, 522, 526 and 530) are shifted down, relative to FIG. 5A, so that the new distributions for the source-side storage elements are more centrally aligned with the distributions for the drain-side storage elements. As a result, more of the storage elements have a centralized Vth distribution, such as depicted in FIG. 5G. See also FIGS. 5D and 5E, in which a transition for the distributions of the source-side storage elements is depicted in greater detail, as an example.

Figure 5C:
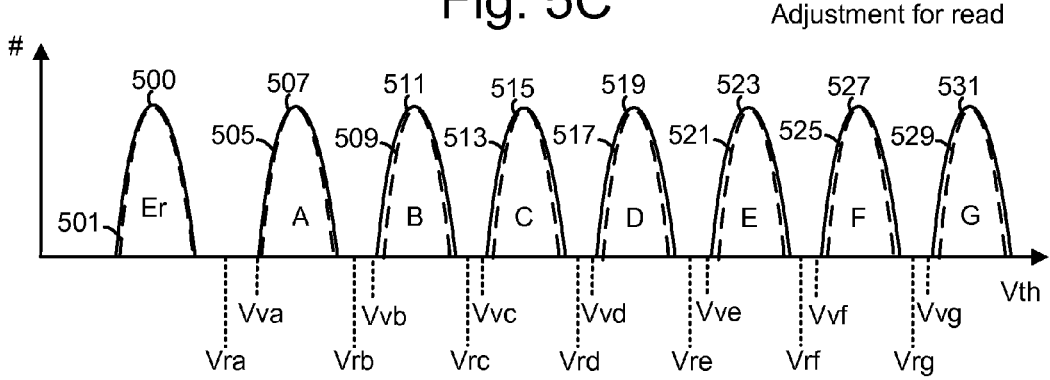
FIG. 5C depicts the example set of threshold voltage distributions of FIG. 5A, where word line-position effects are reduced using adjusted sensing techniques, during a read operation.

FIG. 5C depicts the example set of Vth distributions of FIG. 5A, where word line-position effects are reduced using adjusted sensing techniques, during a read operation. The distributions for the source-side storage elements are the same as in FIG. 5A. However, the distributions for the drain-side storage elements (new distributions 507, 511, 515, 519, 523, 527 and 531) are shifted up, relative to FIG. 5A, to be more centrally aligned with the distributions for the source-side storage elements. As a result, more of the storage elements have a centralized Vth distribution, such as depicted in FIG. 5G. See also FIGS. 5D and 5F, in which a transition for the distributions of the drain-side storage elements is depicted in greater detail, as an example.

Figure 5D:
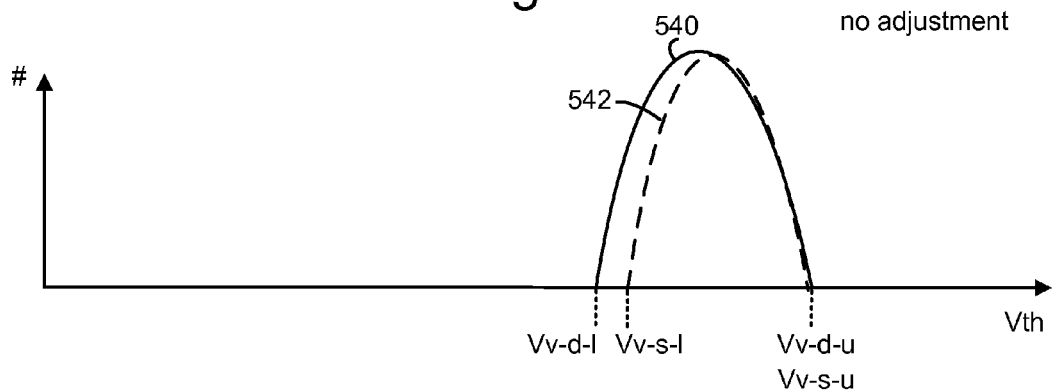
FIG. 5D depicts a distribution for a representative state of FIG. 5A in greater detail.

FIG. 5D depicts a distribution for a representative state of FIG. 5A in greater detail. Distribution 540 is for the drain-side storage elements, and distribution 542 is for the source-side storage elements. For example, for the D state, distribution 540 can be the same as distribution 516, and distribution 542 can be the same as distribution 517. Vv-d-l (d=drain-side storage elements, l=lower edge of distribution) is a representative verify level used in a program-verify operation, and represents the lower edge of the distribution 540. For example, for the D state, VV-d-l=Vvd. Vv-s-l (s=source-side storage elements, l=lower edge of distribution) represents a lower edge of the distribution 542. Vv-d-u (d=drain-side storage elements, u=upper edge of distribution) represents the upper edge of the distribution 540, which is assumed to be about the same as Vv-s-u (s=source-side storage elements, u=upper edge of distribution) which represents the upper edge of the distribution 542.

Figure 5E:
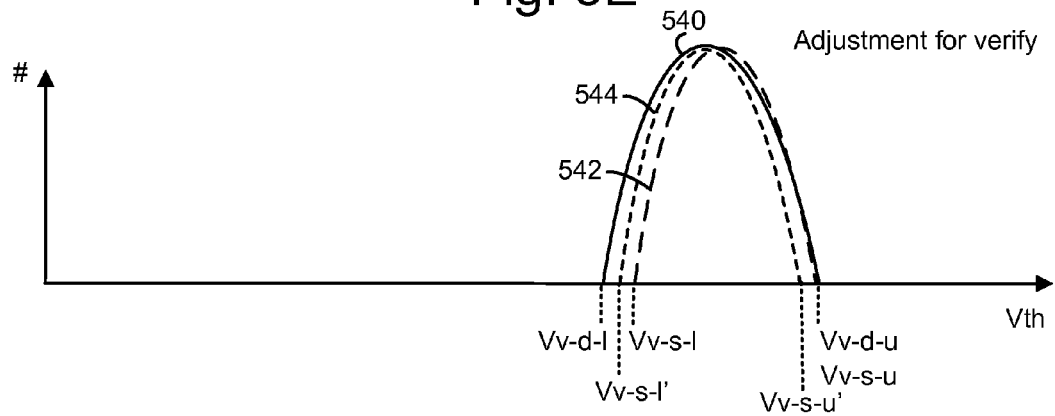
FIG. 5E depicts a distribution for a representative state of FIG. 5B in greater detail.

FIG. 5E depicts a distribution for a representative state of FIG. 5B in greater detail. When a sensing adjustment is made for a verify operation, the distribution of the source-side storage elements (distribution 542) is shifted lower (to distribution 544) to better align with the distribution of the drain-side storage elements (distribution 540). Vv-s-l' (s=source-side storage elements, l'=lower edge of distribution) represents the lower edge of the distribution 544. Vv-s-u' (s=source-side storage elements, u'=upper edge of distribution) represents the upper edge of the distribution 544. The shift is approximately Vv-s-l–Vv-s-l' or Vv-s-u–Vv-s-u'.

Figure 5F:
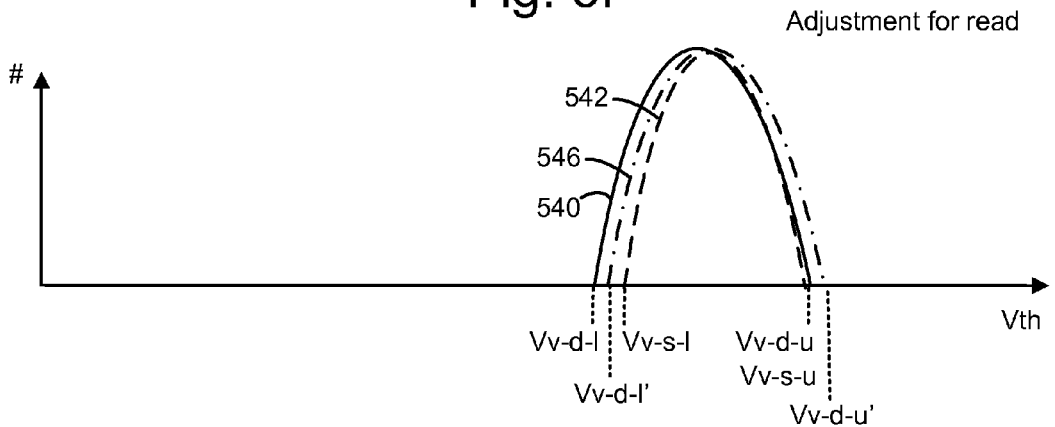
FIG. 5F depicts a distribution for a representative state of FIG. 5C in greater detail.
Figure 5G:
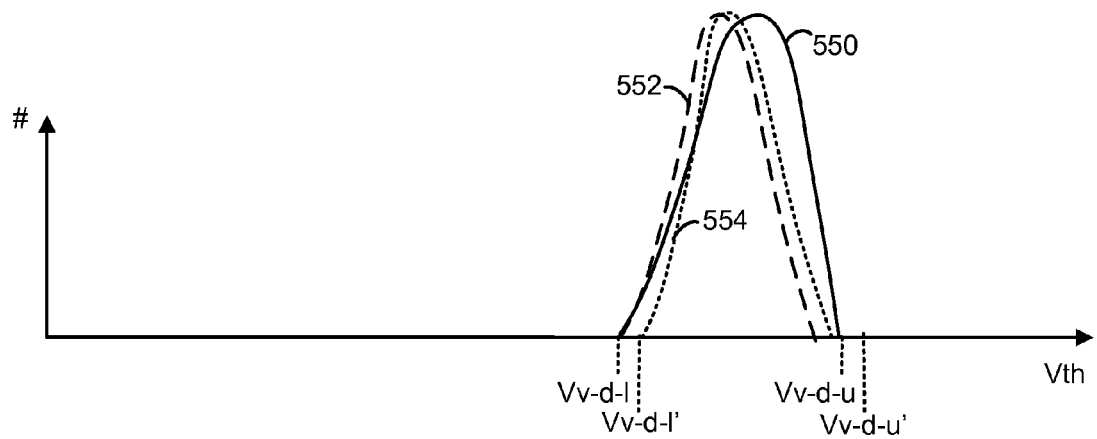
FIG. 5G depicts combined distributions for the representative state of FIG. 5D-5F.

FIG. 5F depicts a distribution for a representative state of FIG. 5C in greater detail. When a sensing adjustment is made for a read operation, the distribution of the drain-side storage elements (distribution 540) is shifted higher (to distribution 546) to better align with the distribution of the source-side storage elements (distribution 542). Vv-d-l' (d=drain-side storage elements, l'=lower edge of distribution) represents the lower edge of the distribution 546. Vv-d-u' (d=drain-side storage elements, u'=upper edge of distribution) represents the upper edge of the distribution 546. The shift is approximately Vv-d-l'–Vv-d-l or Vv-d-u'–Vv-d-u.

FIG. 5G depicts combined distributions for the representative state of FIG. 5D-5F. In particular, the combined distribution 550, which represents a combination of distributions 540 and 542, skews to the right due to the non-alignment of the distributions 540 and 542 from FIG. 5D. In contrast, the combined distribution 552, which represents a combination of distributions 540 and 544 from FIG. 5E, is symmetric and narrower due to the alignment of the distributions 540 and 544. Similarly, the combined distribution 554, which represents a combination of distributions 542 and 546 from FIG. 5F, is symmetric and narrower due to the alignment of the distributions 542 and 546. This result is desirable since the effects of the relative position of the storage element are reduced or removed.

Figure 6A:
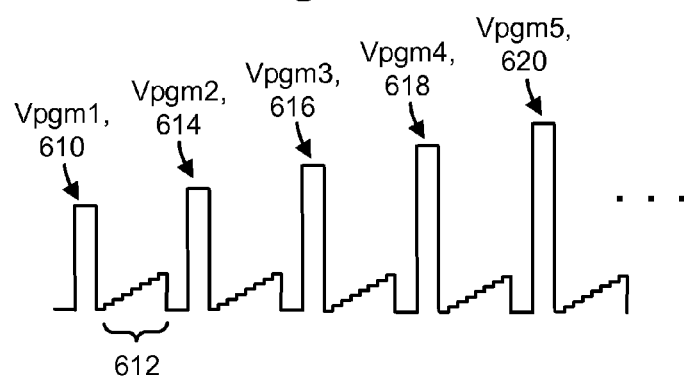
FIG. 6A depicts a voltage waveform applied to the control gates of storage elements during a program operation.

FIG. 6A depicts a voltage waveform applied to the control gates of storage elements during a program operation. The waveform or pulse train includes program pulses 610, 614, 616, 618 and 620 . . . , and a set of verify pulses between each program pulse, including a set of example verify pulses 612, shown in FIG. 6B. The program pulses can be fixed in amplitude, or they can step up by a fixed or varying step size, for instance. When each verify pulse is applied, a verify operation is performed for selected storage elements which are to be programmed to a particular target data state which is associated with the verify pulse, to evaluate the storage element's Vth relative to the verify voltage. A program-verify operation or iteration include a program pulse and the following set of verify pulses.

In one embodiment, the programming pulses have a voltage which starts at an initial level such as 12 V and increases by increments, e.g., 0.5 V, for each successive programming pulse until a maximum of, e.g., 20-25 V is reached. In some embodiments, there can be a verify pulse for each state that data is being programmed into, e.g., state A, B, C . . . . In other embodiments, there can be more or fewer verify pulses. For example, verify pulses may be provided only for state A initially, then for states A and B, then for states B and C and so forth. The waveform may be used during all bit line programming, for instance, in which storage elements of even- and odd-numbered bit lines are programmed together, and verified together. Or, the verify operation can be performed separately, e.g., first for the even-numbered bit lines and then for the odd-numbered bit lines.

Figure 6B:
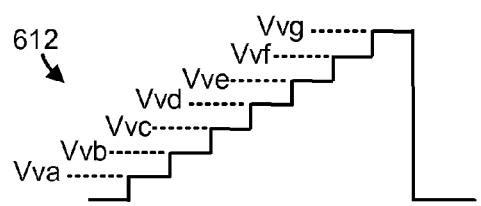
FIG. 6B depicts a voltage waveform applied to the control gates of storage elements during a verify operation.

FIG. 6B depicts a voltage waveform 612 applied to the control gates of storage elements during a verify operation. In an example eight-state embodiment, control gate voltages such as Vva, Vvb, Vvc, Vvd, Vve, Vvf and Vvg can be applied. A verify process for a storage element which is intended to be programmed so that its Vth exceeds a certain control gate voltage, involves applying the control gate voltage and sensing whether the NAND string is in a conductive state. If the NAND string is in a conductive state, the Vth is below the control gate voltage and the storage element will continue to be programmed in the next program-verify operation. If the NAND string is in a non-conductive state, the Vth is above the control gate voltage and the storage element will be locked out from further programming in the next program-verify operation.

Figure 6C:
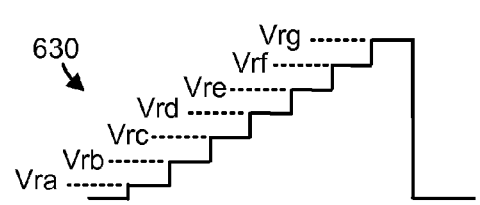
FIG. 6C depicts a voltage waveform applied to the control gates of storage elements during a read operation.

FIG. 6C depicts a voltage waveform 630 applied to the control gates of storage elements during a read operation. For example, control gate voltages such as Vra, Vrb, Vrc, Vrd, Vre, Vrf and Vrg can be applied. A read process for a storage element involves determining the read levels which bound the Vth of the storage element. Or, only one bounding read level need be determined if the storage element is in the erased state or the highest programmed state. In one approach, the control gate read voltages are applied in turn to a word line, starting from the lowest control gate read voltage. At the first sensing operation in which it is determined that the NAND string has reached a conductive state, the Vth is below the control gate voltage and it can be concluded that the storage element is in a data state which is directly below the read level. For example, if the NAND string is first conductive when Vre is applied to a selected word line, we conclude that the associated storage element is in the D state. In this case, the NAND string is non-conductive when Vra through Vrd are applied to the selected word line.

Figure 7:
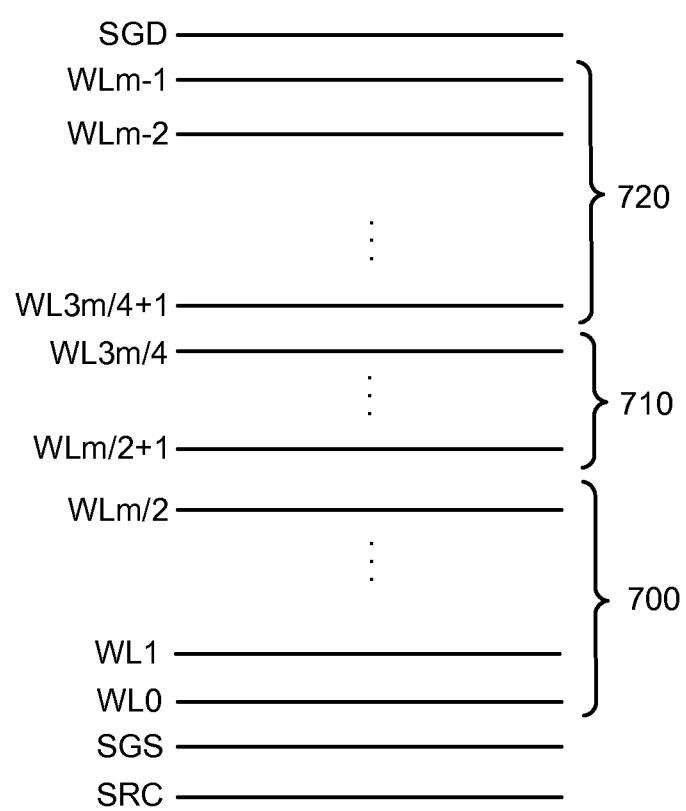
FIG. 7 depicts assignments of word lines to groups.

FIG. 7 depicts assignments of word lines to groups. As mentioned, sensing operations can be adjusted based on the relative position of a storage element in a NAND string, or analogously, based on the relative position of a word line in a set of word lines in a block. The number of groups can be set based on factors such as design complexity, operating margins and a number of digital-to-analog converters available for adjusting sensing operations. Generally, the storage elements of a common group can be treated uniformly in terms of a sensing parameter. Likewise, the different groups use different respective sensing parameters. Assume there are a number "m" word lines, extending from a source side to a drain side and numbered from WL0 to WLm−1. One approach is to provide an equal number of word lines in each group. For example, with four groups, each group can have m/4 contiguous word lines.

Another approach provides groups of different sizes, where a largest group is on a source-side of the block. For example, about one-half of the word lines, e.g., WL0–WLm/2 can be assigned to a first group 700, which is larger than any group, e.g., having at least twice as many word lines as any other group of the block. This approach is consistent with observations that the Vth distributions of these word lines is similar, and is not significantly widened as seen in higher word lines. Accordingly, a uniform sensing treatment is appropriate. The remainder of the word lines can be assigned to respective groups. An approach with minimal overhead uses only two additional groups, such as one group 710 which includes WLm/2+1–WL3m/4, and another group 720 which includes WL3m/4+1–WLm−1. For instance, with m=96 word lines, a first group can include WL0-WL48, a second group can include WL49-WL72 and a third group can include WL73-95. In some cases, the endmost word lines, WL0 and WLm−1 are treated differently for sensing than the other word lines and need not be part of a group. Not all word lines need to be in a group.

The assignment of a word line to a group can be achieved, e.g., by storing data which associates a group identifier with each word line. Such data can be stored, e.g., in a ROM fuse, which is a reserved area in the non-volatile memory array 155 of FIG. 1 for storing system data.

Figure 8A:
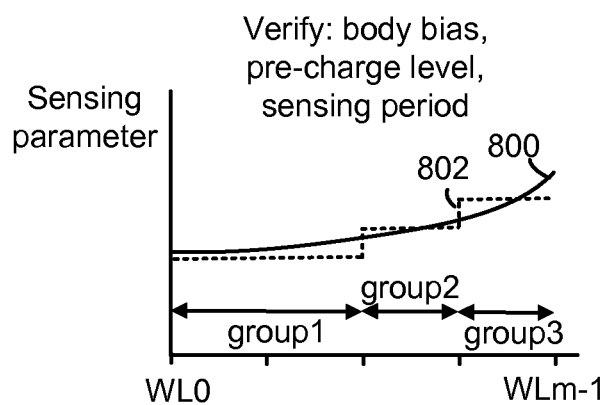
FIGS. 8A-8C depict control curves for adjustment of a sensing parameter based on a group assignment.
Figure 8B:
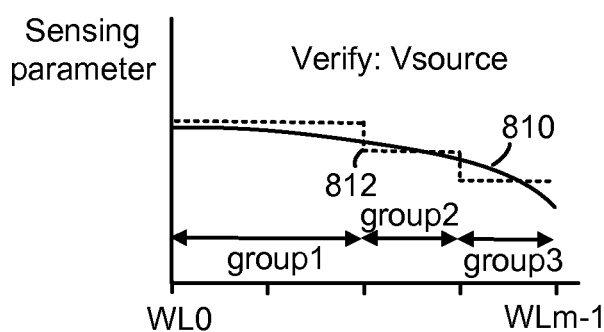
Figure 8C:
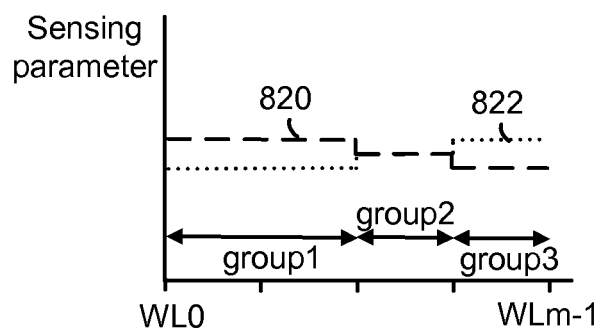

FIGS. 8A-8C depict control curves for adjustment of a sensing parameter based on a group assignment. The x-axis depicts word line number, extending from the source side at WL0 to the drain side at WLm−1. Three groups are depicted as an example, including group1, group2 and group3. The y-axis depicts a sensing parameter, such as body bias, source voltage, sensing time or sensing pre-charge level, which is adjusted based on the group assignment. Typically, a different control curve can be provided for each sensing parameter, and a different sensing parameter of a given type used for each different group. The optimum values of the control curves can be determined from testing and memory device characterization. In FIGS. 8A and 8B, the continuous lines 800 and 810 represent sensing parameter values which can be set for each individual word line, while the stepped, dotted lines 802 and 812 represent sensing parameter value which can be set for groups of word lines. In FIG. 8C, the control curves 820 and 822 represent complementary control curves, where one is used for a verify operation and the other is used for a read operation.

Analogously, the sensing parameter can be adjusted based on word line position in a set of word line, storage element position in a NAND string, a distance of a selected storage element from a source or drain side of a NAND string, or a distance of a selected word line from a source or drain side of a NAND string or array. The distance can be a number of word lines or storage elements which separates the selected storage element, which is being sensed, and the drain or source side of the NAND string or array. As an example, WL3 is a distance of three word lines from a source side of a NAND string.

As mentioned, during a verify operation it is desirable to shift down the Vth distribution of the source-side storage elements. A shift in the distribution can be achieved in different ways. In one approach during a verify operation, a lower body bias (e.g., Vp-well−Vsource in FIG. 4, normally lower than 0.7 V) is used for the group of word lines which is closest to the source side, so that the Vth of a sensed source-side storage element is shifted lower relative to the group of word lines which is close to the drain side, when read at a fixed lower body bias. Generally, a positive (forward) bias or a negative (reverse) bias can be used. It has been observed that the Vth of a storage element decreases as the potential of the body, e.g., the p-well or n-well, increases. Thus, a higher body bias will cause a lower apparent Vth during a verify operation, which will be shifted higher during a read operation with a fixed lower body bias. The control curve of FIG. 8A is appropriate in this case since the lowest body bias is for group1. A highest step of the control curve 812 may represent a zero or non-zero value of body bias. In some cases, applying a negative body bias is impractical, in which case the body bias values may all be non-negative. For instance, this could be achieved by setting the lowest step of the control curve 812 to zero, so that the other, higher steps represent positive voltages.

In one approach taking advantage of body effect, a higher source voltage (Vsource in FIG. 4, body is grounded) causes the Vth of a sensed source-side storage element to shift higher during a verify operation. Lowering Vsource lowers the body effect, so that Vth is lowered as Vsource is lowered during a read operation afterwards such that source-side and drain-side Vth can be aligned better. In this case, the control curves of FIG. 8B are appropriate since the lowest Vsource is provided for group1. In some cases, applying a negative Vsource is impractical, in which case the Vsource values may all be non-negative. For instance, this could be achieved by setting the lowest portion of the control curve 800 or 802 to zero, so that the other, higher steps represent positive voltages.

In another possible approach, the sensing parameter which is adjusted is the bit-line pre-charge voltage. As explained further below, during sensing, sensing circuitry is pre-charged to a specified voltage, and the sensing circuitry is allowed to communicate with the NAND string. Based on an amount of discharge, a conductive or non-conductive state of the NAND string, and the selected storage element which is being sensed, can be determined. The pre-charge level which is the sensing parameter can be at various locations, such as in a capacitor or other charge-storing element in a current or voltage sensing module. See FIGS. 9A and 10A for further details of example sensing circuitry.

Furthermore, the sensing period at the end of which a decision is made regarding the level of discharge can be a sensing parameter. A sensing time can represent the end of the sensing period in which the sensing circuitry is allowed to communicate with the NAND string.

In some cases, in a verify operation, a lower pre-charge level will effectively shift down the Vth. When a nominal pre-charge level is used, the sensing circuitry senses at a certain current level; when a smaller pre-charge level is used during a verify operation for the group of word lines which is closest to the source side, the sensing circuitry senses at a lower current level, and it can be harder for some of the storage elements whose Vth is a little below the verify level to pass enough current at the sensing time, and to be considered to be non-conductive and "verify pass" by the sensing circuitry. As a result, the Vth distribution will shift lower compared to the group of word lines which is close to the drain side when they are read at a fixed pre-charge level. The control curves 800 and 802 of FIG. 8A are therefore appropriate to represent pre-charge level in a verify operation because a lower pre-charge level is used for group1.

Similarly, when a longer sensing period is used, in a verify operation, it can be easier for a storage element to be considered to be conductive and "no-pass" by the sensing circuitry, so that a longer sensing period results in a higher Vth distribution. Using the pre-charge level as a sensing parameter can result in more predictable results in some cases, compared to setting the sensing period. This is because the slope of a voltage discharge during sensing can vary with time so that changing the sensing period can result in substantial undesired shifts in the Vth distribution. In contrast, the pre-charge level tends to be more controllable parameter. The control curves 800 and 802 of FIG. 8A are therefore appropriate to represent sensing time in a verify operation because a smaller discharge time is used for group1.

Note that a combination of sensing parameters could be adjusted as well to achieve desired shifts in the Vth distributions.

Thus, a control curve of FIG. 8A can be used for a verify operation, when the sensing parameter is body bias, pre-charge level or discharge time/sensing period, and a control curve of FIG. 8B can be used for a verify operation, when the sensing parameter is Vsource. For a read operation, generally the sensing parameter should have an opposite trend compared to the verify operation. For example, a control curve of FIG. 8A can be used for a read operation, when the sensing parameter is Vsource, and a control curve of FIG. 8B can be used for a read operation, when the sensing parameter is body bias, pre-charge level or discharge time/sensing period.

As mentioned, in FIG. 8C, the control curves 820 and 822 represent complementary, countervailing control curves, where one is used for a verify operation and the other is used for a read operation. Generally, one option for compensating for the effect of word line position can involve adjusting verify sensing only, adjusting read sensing only, and a further option, depicted by FIG. 8C, can involve adjusting both verify and read sensing in opposite ways. As mentioned, the adjustment for verify and read sensing can use opposing or countervailing control curves, so that one control curve 822 increases with group number, and the other control curve 820 decreases with group number. The rate of the increase or decrease, and the corresponding amount of the adjustment, e.g., the shift in Vth, can be roughly equal in the verify sensing and read sensing, or the verify sensing can provide more adjustment than the read sensing, or the verify sensing can provide less adjustment than the read sensing. As an example, control curve 822 could represent an attenuated version of the control curve 802 for pre-charge level during a verify operation, in which case control curve 820 could represent pre-charge level during a read operation.

Figure 8D:
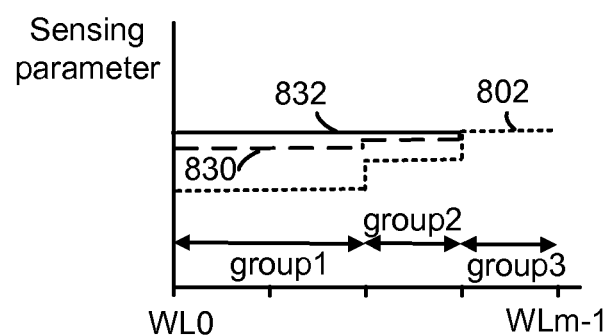
FIG. 8D depicts control curves for adjustment of a sensing parameter based on a group assignment and based on a data state or control gate voltage.

FIG. 8D depicts control curves for adjustment of a sensing parameter based on a group assignment and based on a data state or control gate voltage. An increasing trend with increasing group number is seen. In some memory devices, one or more of the lowest programmed data states may be relatively unaffected by word line position effects, so that a sensing adjustment need not be used, or a reduced sensing adjustment may be used. For example, control curve 802, which is the same as in FIG. 8A, may be used for sensing operations associated with higher data states and their control gate levels, control curve 830 may be used for sensing operations associated with mid-level data states and their control gate levels, and control curve 832, which is flat, may be used for sensing operations associated with the one or more of the lowest programmed states and their control gate levels. Generally, two or more control curves can be used, where each control curve is used for a different group.

As another example, control curve 802 may be used for sensing operations associated with mid-level and higher data states and their control gate levels, and control curve 832 may be used for sensing operations associated with the one or more of the lowest programmed states and their control gate levels. To illustrate, in an eight-state embodiment, control curve 802 may be used for sensing operations associated with states B-G and their control gate levels Vvb, Vvc, Vvd, Vve, Vvf and Vvg for a verify operation. Control curve 832 may be used for sensing operations associated with the A state and its control gate level Vva for a verify operation.

Figure 8E:
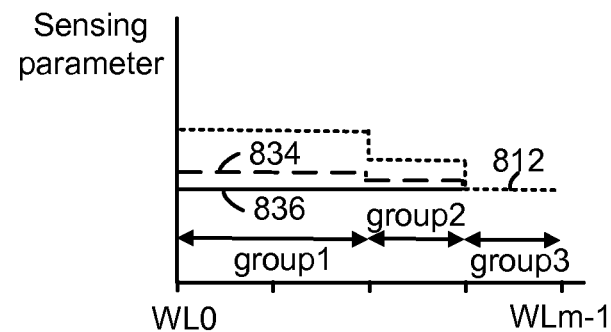
FIG. 8E depicts another set of control curves for adjustment of a sensing parameter based on a group assignment and based on a data state or control gate voltage.

FIG. 8E depicts another set of control curves for adjustment of a sensing parameter based on a group assignment and based on a data state or control gate voltage. A decreasing trend with increasing group number is seen. For example, control curve 812, which is the same as in FIG. 8B, may be used for sensing operations associated with higher data states and their control gate levels, control curve 834 may be used for sensing operations associated with mid-level data states and their control gate levels, and control curve 836, which is flat, may be used for sensing operations associated with the one or more of the lowest programmed states and their control gate levels.

The adjustment of sensing can be understood further in view of the following example sensing circuits and control schemes.

FIG. 9A depicts a configuration of a NAND string and sensing circuitry when current sensing is used. A simple NAND string 912 includes four storage elements which are in communication with word lines WL0, WL1, WL2 and WL3, respectively. The storage elements are coupled to a p-well region of a substrate. A bit line 910 having a voltage Vb1 is depicted, in addition to sensing circuitry 900. A BLS (bit line sense) transistor 906, coupled to the bit line 910, is a high voltage transistor, and is made conductive in response to a control 908 during sense operations. A BLC (bit line clamp) transistor 904 is a low voltage transistor which is made conductive in response to the control 908 at a start of a sensing period to allow the bit line to communicate with a current sensing module 902. During a sense operation, such as a read or verify operation, a pre-charge operation occurs in which a capacitor in the current sensing module 902 is charged. The BLC transistor 904 may be made conductive to allow the pre-charging. The pre-charge level in the current sensing module 901 can be a sensing parameter, for example. The BLC transistor can be used to set a bit line voltage as Vb1=Vb1c–Vth, where the Vth is of the BLC transistor. The selected word line receives a read or verify control gate voltage, and Vsource and Vp-well are set.

At the drain side of the NAND string 930, the BLS transistor 910 is made conductive. Additionally, Vb1c is applied to the BLC transistor 900 to allow the current sensing module 902 to communicate with the bit line. The pre-charged capacitor in the current sensing module 902 discharges through the bit line and into the source so that the source acts as a current sink. The pre-charged capacitor at the drain of the NAND string may be pre-charged to a potential which exceeds a potential of the source so that a current flows through the selected non-volatile storage element and sinks into the source when the selected storage element is in the conductive state.

If the selected storage element is in a conductive state due to the application of the control gate verify or read voltage, a relatively high current will flow in the NAND string. If the selected storage element is in a non-conductive state, no or relatively little current will flow. The current sensing module 902 can sense the cell/storage element current, icell. In one possible approach, the current sensing module determines a voltage drop which is tied to a fixed current flow by the relationship $\Delta V=i \cdot t/C$, where $\Delta V$ is the voltage drop, i is the fixed current, t is a discharge/sensing time period and C is the capacitance of the pre-charged capacitor in the current sensing module. The sensing period can be an adjustable sensing parameter as discussed. See also FIG. 9D, which depicts voltage drop with time for different lines of fixed current. The greater voltage drops represent higher currents. At the end of the sensing period, since i and C are fixed, $\Delta V$ for a given current can be determined. In one approach, a p-mos transistor is used to determine a level of $\Delta V$ relative to a demarcation value. In another possible approach, a cell current discriminator serves as a discriminator or comparator of current levels by determining whether the conduction current is higher or lower than a given demarcation current.

The current sensing module 902 thus can determine whether the selected storage element is in a conductive or non-conductive state by the level of current. Generally, a higher current will flow when the selected storage element is in a conductive state and a lower current will flow when the selected storage element is in a non-conductive state. A Vth of the selected storage element is above or below the control gate voltage, such as a verify level or a read level, when it is in a non-conductive state or a conductive state, respectively.

Figure 9B:
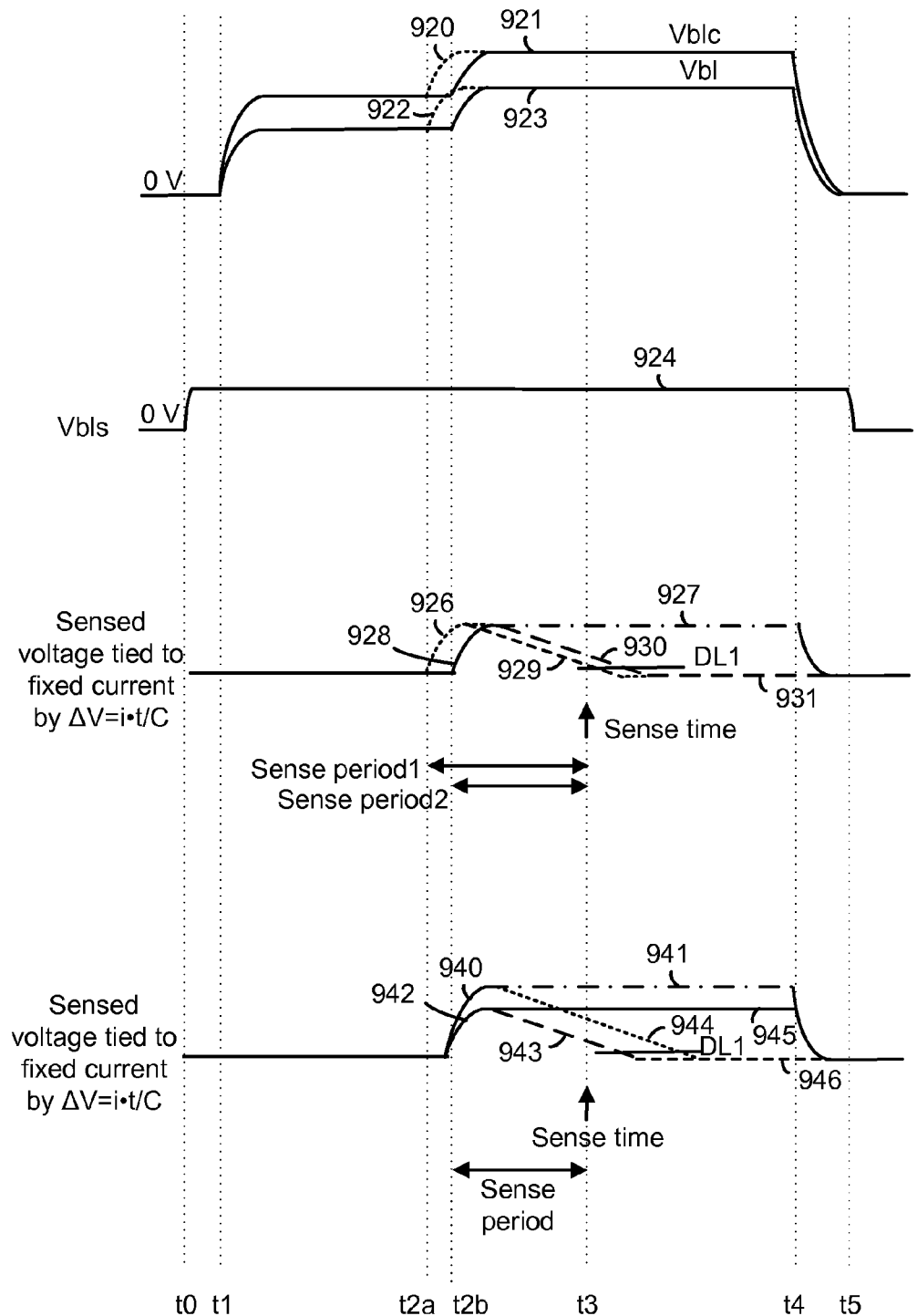
FIG. 9B depicts waveforms associated with FIG. 9A.

FIG. 9B depicts waveforms associated with FIG. 9A. In one approach, different sensing periods are used, and a fixed pre-charge level is used. Waveform 920 depicts Vb1c and waveform 922 depicts Vb1, when a longer sensing period (sensing period1) is used. Waveform 921 depicts Vb1c and waveform 923 depicts Vb1, when a shorter sensing period (sensing period2) is used. Waveform 924 depicts Vb1s.

Waveforms 926 and 927 depict a sense voltage when the longer sensing period is used, and a sensed storage element is non-conductive. Waveforms 926 and 929 depict a sense voltage when the longer sensing period is used, and a sensed storage element is conductive. Waveforms 928 and 927 depict a sense voltage when the shorter sensing period is used, and a sensed storage element is non-conductive. Waveforms 928 and 930 depict a sense voltage when the shorter sensing period is used, and a sensed storage element is conductive. Waveform 931 depicts a discharge level.

Vb1 increases with Vb1c between t1 and t2. At t2, the pre-charged capacitor is discharged. In practice, after rising, Vb1 will drop slightly (not shown) if current flows in the NAND string. For example, Vb1 may rise to 1 V when Vb1c=2 V and the Vth of the BLC transistor is 1 V. When sensing, if current flows, Vb1 may drop from 1 V to 0.9 V, for instance. Thus, the capacitor can start to discharge at t2a when the longer sensing period is used, or at t2b when the shorter sensing period is used. t3 is a sense time, at an end of the sensing or discharge period. A determination can be made at t3 as to whether the sensed voltage exceeds a demarcation level. It can be concluded that the selected storage element is conductive when the voltage drops below the demarcation level (DL1), or that the selected storage element is non-conductive if the voltage does not drop below the demarcation level.

In another approach, a fixed sensing period is used, but different pre-charge levels are used. Waveforms 940 and 941 depict a sense voltage when a higher pre-charge level is used, and a sensed storage element is non-conductive. Waveforms 940 and 944 depict a sense voltage when the higher pre-charge level is used, and the sensed storage element is conductive. Waveforms 942 and 945 depict a sense voltage when a lower pre-charge level is used, and a sensed storage element is non-conductive. Waveforms 942 and 943 depict a sense voltage when the lower pre-charge level is used, and a sensed storage element is conductive. Waveform 946 depicts a discharge level. The demarcation level (DL1) is also depicted.

Figure 9C:
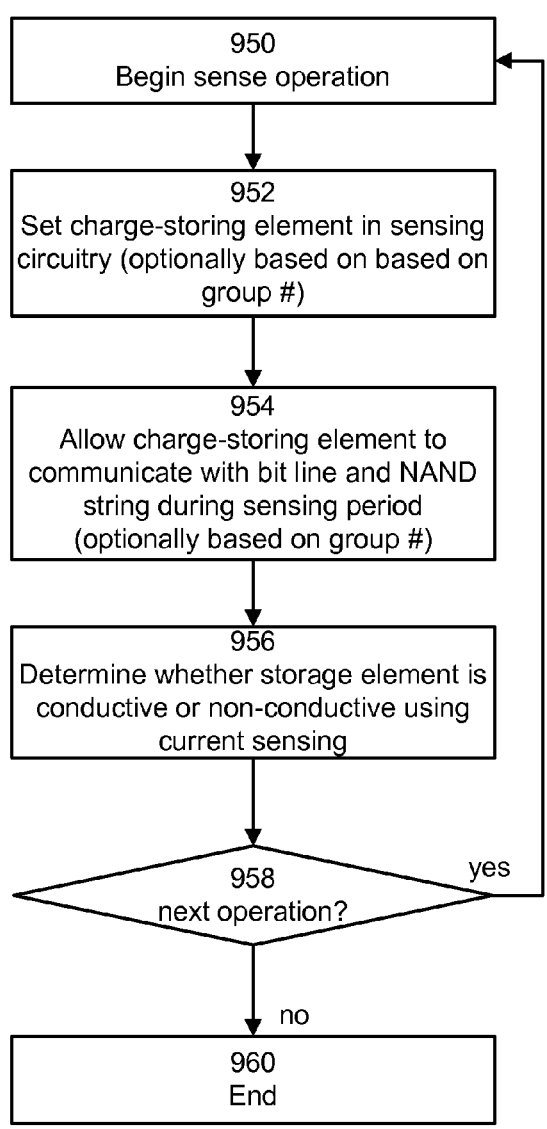
FIG. 9C depicts a sensing process which applies to the current sensing circuitry of FIG. 9A or the voltage sensing circuitry of FIG. 10A.
Figure 9D:
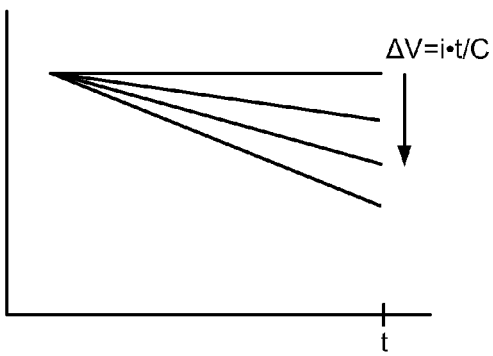
FIG. 9D depicts voltage drop with time for different lines of fixed current.
Figure 10A:
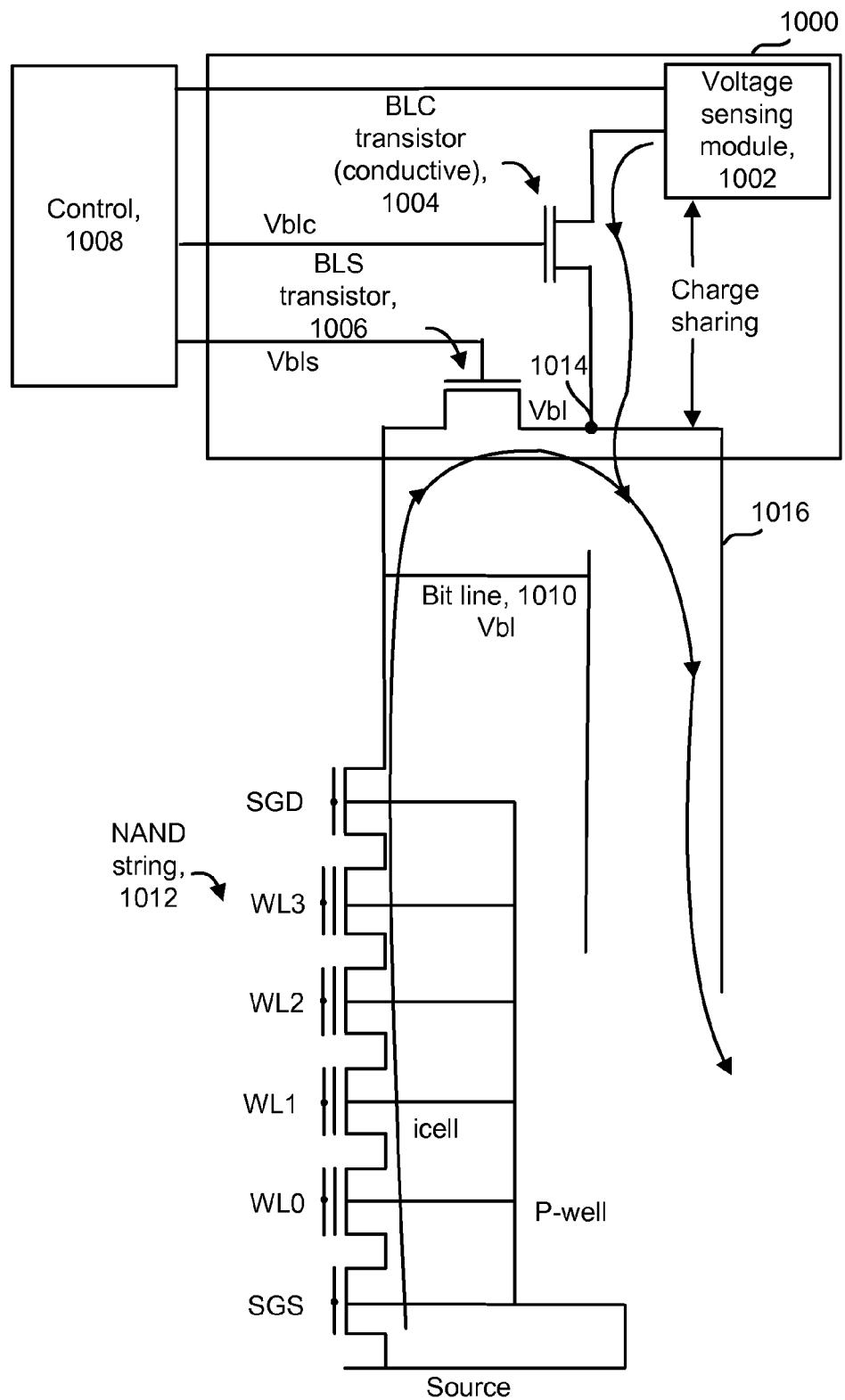
FIG. 10A depicts a configuration of a NAND string and sensing circuitry when voltage sensing is used.

FIG. 9C depicts a sensing process which applies to the current sensing circuitry of FIG. 9A or the voltage sensing circuitry of FIG. 10A. A sense operation, such as a read or verify operation, begins at step 950. Step 952 includes setting a charge-storing element in the sensing circuitry to a desired level which is optionally based on a group number of the storage element being sensed in the associated NAND string. Step 954 includes allowing the charge-storing element to communicate with the bit line and the NAND string during a sensing period which is optionally based on the group number. Step 956 includes determining whether the storage element is conductive or non-conductive using current sensing. If another sense operation is to be performed, at decision step 958, the control flow continues at step 950. Otherwise, the process ends at step 960. As mentioned, one or more sensing parameters can be adjusted in the sensing operation.

In another approach, voltage sensing can be used. Note that the terms "current sensing" and "voltage sensing" are used informally since both can involve sensing a voltage. In contrast to current sensing, voltage sensing does not involve sensing a voltage drop which is tied to a fixed current. Instead, voltage sensing involves determining whether charge sharing occurs between a capacitor in a voltage sensing module and a capacitance of the bit line. Current is not fixed or constant during the sensing. Little or no charge sharing occurs when the selected storage element is conductive, in which case the voltage of the capacitor in the voltage sensing module does not drop significantly. Charge sharing does occur when the selected storage element is non-conductive, in which case the voltage of the capacitor in the voltage sensing module does drop significantly.

FIG. 10A depicts a configuration of a NAND string and sensing circuitry when voltage sensing is used. An example NAND string 1012 includes four storage elements which are in communication with word lines WL0, WL1, WL2 and WL3, respectively. A bit line 1010 having a voltage Vb1 is depicted, in addition to sensing circuitry 1000. A BLS transistor 1006, which is initially conductive, is coupled to the bit line 1010 via a sense node 1014. The BLS transistor 1006 is a high voltage transistor, and is made conductive in response to a control 1008 during sense operations. A BLC transistor 1004, which is non-conductive initially, is a low voltage transistor which is made conductive in response to the control 1008 to allow the bit line to communicate with a voltage sensing module/circuit 1002. During a sense operation, such as a read or verify operation, a pre-charge operation occurs in which a capacitor in the voltage sensing module 1002 is charged. The BLC transistor 1004 may be made conductive to allow the pre-charging. The pre-charge level of a charge-storing element in the voltage sensing module 1002 can be an adjustable sensing parameter as discussed.

During sensing, the bit line will charge up to a level which is based on the Vth of the selected storage element, and a body effect. After a certain amount of time, all the bit lines reach their DC levels, and the BLC transistor 1004 is made conductive to allow charge sharing between the voltage sensing module 1002 and the sense node 1014 so that voltage sensing of the threshold voltage of the selected storage element can occur. The voltage sensing module 1002 may perform voltage sensing as part of a reading or verifying operation, for instance.

When voltage sensing occurs, the BLC transistor 1004 is made conductive so that current flows from the voltage sensing module 1002 toward the discharge path 1016, in addition to the current being discharged from the NAND string 1012 flowing toward the discharge path 1016.

FIG. 10B depicts waveforms associated with FIG. 10A. Waveform 1040 depicts Vsource, and waveform 1042 depicts Vb1s. Waveform 1044 depicts Vb1c when a longer sensing period (sensing period1) is used, and waveform 1046 depicts Vb1c when a shorter sensing period (sensing period2) is used. In one approach, different sensing periods are used while a fixed pre-charge level is used. Waveform 1034 depicts a sensed voltage when the shorter or longer sensing period is used and the sensed storage element is non-conductive. Waveform 1030 depicts a sensed voltage when the longer sensing period is used and the sensed storage element is conductive. Waveform 1032 depicts a sensed voltage when the shorter sensing period is used and the sensed storage element is conductive. Waveform 1036 depicts a discharge level. A demarcation level (DL2) is also depicted. The longer sensing period extends between t3a and t4, while the shorter sensing period extends between t3b and t4.

In another approach, a fixed sensing period is used while different pre-charge levels are used. Waveform 1026 depicts a sensed voltage when a higher pre-charge level is used and the sensed storage element is conductive. Waveform 1024 depicts a sensed voltage when a lower pre-charge level is used and the sensed storage element is conductive. Waveform 1022 depicts a sensed voltage when the higher pre-charge level is used and the sensed storage element is non-conductive. Waveform 1020 depicts a sensed voltage when the lower pre-charge level is used and the sensed storage element is non-conductive. A demarcation level (DL2) is also depicted.

As mentioned, during voltage sensing, charge sharing between the voltage sensing module and the bit line occurs when the selected storage element is non-conductive. This charge sharing lowers the sensed voltage at the voltage sensing module. Little or no charge sharing between the voltage sensing module and the bit line occurs when the selected storage element is conductive so that the sensed voltage at the voltage sensing module remains high.

At t0, Vb1s increases so that the BLS transistor is conductive. At t1, Vsource is applied as a common source voltage for a set of NAND strings. At t3a or t3b, the BLC transistor is made conductive by increasing Vb1c as depicted by waveform 1004 or 1006, respectively, thereby starting the sensing period. The voltage sensing components may use a voltage demarcation level DL2 at a specified sense time t4, at the end of the sensing period, to determine whether the selected storage element is conductive or non-conductive.

Vsource is lowered at t5 and the BLS transistor is made non-conductive at t6, indicating the end of the sense operation. Vp-well may be set at 0 V during the sensing, in one possible approach. The selected word line receives a read or verify control gate voltage while the unselected word lines can receive read pass voltages according to the particular sensing scheme.

Accordingly, in one embodiment, a method is provided for sensing a selected non-volatile storage element in a NAND string which comprises non-volatile storage elements connected in series, and which has a source side and a drain side.

The method includes assigning each non-volatile storage element of the NAND string to a group, where the NAND string is connected at the drain side to a bit line, the bit line is connected to sensing circuitry, multiple groups having different sizes are provided, and a group of the multiple groups which is closest to the source side has more non-volatile storage elements of the NAND string than any other group of the multiple groups. The method further includes sensing whether a threshold voltage of the selected non-volatile storage element is above a control gate voltage using the sensing circuitry, where the sensing is adjusted based on a group of the multiple groups to which the selected non-volatile storage element is assigned.

In another embodiment, a non-volatile storage system includes a NAND string comprising non-volatile storage elements connected in series, including a selected non-volatile storage element, where the NAND string has a source side and a drain side. Further, sensing circuitry is connected to the drain side of the NAND string via a bit line. At least one control circuit is also provided. The at least one control circuit stores data which assigns each non-volatile storage element of the NAND string to a group, multiple groups having different sizes are provided, and a group of the multiple groups which is closest to the source side has more non-volatile storage elements of the NAND string than any other group of the multiple groups. The at least one control circuit senses whether a threshold voltage of the selected non-volatile storage element is above a control gate voltage using the sensing circuitry, where the at least one control circuit uses a sensing technique which is based on a group of the multiple groups to which the selected non-volatile storage element is assigned.

In another embodiment, a method is provided for sensing a selected non-volatile storage element in a NAND string which comprises non-volatile storage elements connected in series, and which has a source side and a drain side. The method includes, during a verify operation: performing sensing for the selected non-volatile storage element by applying a control gate voltage at a verify level to the selected non-volatile storage element, pre-charging a sensing circuit to an associated pre-charge level, allowing the sensing circuit to communicate with the NAND string for an associated sensing period, and determining whether a threshold voltage of the selected storage element exceeds the control gate voltage at an end of the associated sensing period, where at least one of the associated pre-charge level and the associated sensing period of the verify operation is a function of a distance of the selected non-volatile storage element from the source side. The method further includes, during a read operation: performing sensing for the selected non-volatile storage element by applying a control gate voltage at a read level to the selected non-volatile storage element, pre-charging the sensing circuit to an associated pre-charge level, allowing the sensing circuit to communicate with the NAND string for an associated sensing period, and determining whether the threshold voltage of the selected storage element exceeds the control gate voltage at an end of the associated sensing period, where at least one of the associated pre-charge level and the associated sensing period of the read operation is a function of the distance of the selected non-volatile storage element from the source side.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for sensing a selected non-volatile storage element in a NAND string which comprises non-volatile storage elements connected in series, and which has a source side and a drain side, the method comprising:
   assigning each non-volatile storage element of the NAND string to a group among multiple groups in the NAND string, the multiple groups have different sizes and extend between the source side and the drain side of the NAND string, the selected non-volatile storage element is assigned to one group of the multiple groups, the NAND string is connected at the drain side to a bit line, the bit line is connected to sensing circuitry, and a group of the multiple groups which is closest to the source side has more non-volatile storage elements of the NAND string than any other group of the multiple groups; and
   sensing whether a threshold voltage of the selected non-volatile storage element is above a control gate voltage using the sensing circuitry, the sensing is adjusted based on a position of the one group in the NAND string.

2. The method of claim 1, wherein:
   the group which is closest to the source side has at least twice as many non-volatile storage elements of the NAND string than any other group of the multiple groups.

3. The method of claim 1, wherein:
   the sensing is adjusted by adjusting a body bias of a substrate on which the NAND string is formed, based on the position of the one group in the NAND string.

4. The method of claim 1, wherein:
   the sensing is adjusted by adjusting a body effect by adjusting a voltage of the source side, based on the position of the one group in the NAND string.

5. The method of claim 1, wherein:
   the sensing is adjusted by adjusting a pre-charge level of the sensing circuitry based on the position of the one group in the NAND string.

6. The method of claim 1, wherein:
   the sensing is adjusted by adjusting a sensing period of the sensing circuitry based on the position of the one group in the NAND string.

7. The method of claim 1, wherein:
   the sensing is adjusted based on a level of the control gate voltage.

8. The method of claim 7, wherein:
   the non-volatile storage elements of the NAND string are able to store data in multiple data states; and
   the sensing is adjusted based on a data state associated with the control gate voltage.

9. The method of claim 7, wherein:
   the sensing is adjusted by adjusting a pre-charge level of the sensing circuitry, based on the level of the control gate voltage.

10. The method of claim 7, wherein:
    the sensing is adjusted by adjusting a sensing period of the sensing circuitry, based on the level of the control gate voltage.

11. A non-volatile storage system, comprising:
a NAND string comprising non-volatile storage elements connected in series, including a selected non-volatile storage element, the NAND string has a source side and a drain side;
sensing circuitry connected to the drain side of the NAND string via a bit line; and
at least one control circuit, the at least one control circuit stores data which assigns each non-volatile storage element of the NAND string to a group among multiple groups in the NAND string, the multiple groups have different sizes and extend between the source side and the drain side of the NAND string, the selected non-volatile storage element is assigned to one group of the multiple groups, and a group of the multiple groups which is closest to the source side has more non-volatile storage elements of the NAND string than any other group of the multiple groups, the at least one control circuit senses whether a threshold voltage of the selected non-volatile storage element is above a control gate voltage using the sensing circuitry, the at least one control circuit uses a sensing technique which is based on a position of the one group in the NAND string.

12. The non-volatile storage system of claim 11, wherein:
a group of the multiple groups which is closest to the source side has more non-volatile storage elements of the NAND string than any other group of the multiple groups.

13. The non-volatile storage system of claim 11, wherein:
the sensing technique adjusts a pre-charge level to compensate for a tendency of the selected non-volatile storage element to have a higher threshold voltage when the selected non-volatile storage element is closer to the source side than to the drain side.

14. The non-volatile storage system of claim 11, wherein:
the sensing technique is based on a level of the control gate voltage.

15. A method for sensing a selected non-volatile storage element in a NAND string which comprises non-volatile storage elements connected in series, and which has a source side and a drain side, the method comprising:
during a verify operation: performing sensing for the selected non-volatile storage element by applying a control gate voltage at a verify level to the selected non-volatile storage element, pre-charging a sensing circuit to an associated pre-charge level, allowing the sensing circuit to communicate with the NAND string for an associated sensing period, and determining whether a threshold voltage of the selected storage element exceeds the control gate voltage at an end of the associated sensing period, at least one of the associated pre-charge level or the associated sensing period of the verify operation is a function of a distance of the selected non-volatile storage element from the source side; and
during a read operation: performing sensing for the selected non-volatile storage element by applying a control gate voltage at a read level to the selected non-volatile storage element, pre-charging the sensing circuit to an associated pre-charge level, allowing the sensing circuit to communicate with the NAND string for an associated sensing period, and determining whether the threshold voltage of the selected storage element exceeds the control gate voltage at an end of the associated sensing period, at least one of the associated pre-charge level or the associated sensing period of the read operation is a function of the distance of the selected non-volatile storage element from the source side.

16. The method of claim 15, wherein:
the associated pre-charge level during the verify operation is lower when the distance is lower; and
the associated pre-charge level during the read operation is higher when the distance is lower.

17. The method of claim 15, wherein:
the associated sensing period during the verify operation is lower when the distance is lower; and
the associated sensing period during the read operation is higher when the distance is lower.

18. The method of claim 15, further comprising:
assigning each non-volatile storage element of the NAND string to a group among multiple groups in the NAND string, the multiple groups have different sizes and extend between the source side and the drain side of the NAND string, the selected non-volatile storage element is assigned to one group of the multiple groups, the at least one of the associated pre-charge level or the associated sensing period of the verify operation is a function of a position of the one group in the NAND string, and the at least one of the associated pre-charge level or the associated sensing period of the read operation is a function of the position of the one group in the NAND string.

19. The method of claim 15, wherein:
a group of the multiple groups which is closest to the source side has more non-volatile storage elements of the NAND string than any other group of the multiple groups.

20. A non-volatile storage system, comprising:
a NAND string comprising non-volatile storage elements connected in series, including a selected non-volatile storage element, the NAND string has a source side and a drain side;
a sensing circuit connected to the drain side of the NAND string via a bit line; and
at least one control circuit, the at least one control circuit:
during a verify operation: to sense the selected non-volatile storage element, applies a control gate voltage at a verify level to the selected non-volatile storage element, pre-charges the sensing circuit to an associated pre-charge level, allows the sensing circuit to communicate with the NAND string for an associated sensing period, and determines whether a threshold voltage of the selected storage element exceeds the control gate voltage at an end of the associated sensing period, at least one of the associated pre-charge level or the associated sensing period of the verify operation is a function of a distance of the selected non-volatile storage element from the source side; and
during a read operation: to sense the selected non-volatile storage element, applies a control gate voltage at a read level to the selected non-volatile storage element, pre-charges the sensing circuit to an associated pre-charge level, allows the sensing circuit to communicate with the NAND string for an associated sensing period, and determines whether the threshold voltage of the selected storage element exceeds the control gate voltage at an end of the associated sensing period, at least one of the associated pre-charge level or the associated sensing period of the read operation is a function of the distance of the selected non-volatile storage element from the source side.

* * * * *